United States Patent
Matsuda (10) Patent No.: US 6,854,832 B2
(45) Date of Patent: Feb. 15, 2005

(54) LAMINATE HAVING MONO-CRYSTAL OXIDE CONDUCTIVE MEMBER ON SILICON SUBSTRATE, ACTUATOR USING SUCH LAMINATE, INK JET HEAD AND METHOD FOR MANUFACTURING SUCH HEAD

(75) Inventor: Takanori Matsuda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 54 days.

(21) Appl. No.: 10/414,473

(22) Filed: Apr. 16, 2003

(65) Prior Publication Data

US 2003/0197174 A1 Oct. 23, 2003

(30) Foreign Application Priority Data

Apr. 18, 2002 (JP) ........................................ 2002-116136

(51) Int. Cl.⁷ ................................................ B41J 2/045
(52) U.S. Cl. ......................................................... 347/68
(58) Field of Search .............................. 347/68, 70, 71; 117/103; 257/43, 352; 438/198; 505/434; 29/25.35

(56) References Cited

U.S. PATENT DOCUMENTS

| | | | | |
|---|---|---|---|---|
| 3,999,282 A | * | 12/1976 | Ono et al. ................. | 438/198 |
| 5,352,656 A | * | 10/1994 | Lackey et al. ............. | 505/434 |
| 5,431,958 A | | 7/1995 | Desu et al. | |
| 5,828,080 A | * | 10/1998 | Yano et al. .................. | 257/43 |
| 6,096,434 A | | 8/2000 | Yano et al. | |
| 6,605,151 B1 | * | 8/2003 | Wessels et al. ............. | 117/103 |
| 6,768,175 B1 | * | 7/2004 | Morishita et al. .......... | 257/352 |
| 2002/0076875 A1 | | 6/2002 | Wasa et al. | |
| 2002/0140320 A1 | | 10/2002 | Unno et al. | |
| 2003/0003695 A1 | | 1/2003 | Unno et al. | |

FOREIGN PATENT DOCUMENTS

| | | |
|---|---|---|
| JP | 6-280023 | 10/1994 |
| JP | 11-26296 | 1/1999 |

* cited by examiner

*Primary Examiner*—Anh T.N. Vo
(74) *Attorney, Agent, or Firm*—Fitzpatrick, Cella, Harper & Scinto

(57) ABSTRACT

In a mono-crystal oxide conductive member on a silicon substrate, including an electrode material of a perovskite type piezoelectric element and an electrostrictive material and an oxide conductive material as a film formation substrate, a distance x between silicon atoms and a distance y between atoms of the mono-crystal oxide conductive member satisfy the following relationship:

$$Z = \left| \frac{my}{nx} - 1 \right|_{min} \geq 0.05$$

(n and m are given positive integers, $1 \leq n \leq 5$, $1 \leq m \leq 7$ and $nx \leq 3$, $my \leq 3$).

13 Claims, 6 Drawing Sheets

LAMINATE HAVING MONO-CRYSTAL OXIDE CONDUCTIVE MEMBER ON SILICON SUBSTRATE, ACTUATOR USING SUCH LAMINATE, INK JET HEAD AND METHOD FOR MANUFACTURING SUCH HEAD

BACKGROUND OF THE INVENTION

1. Field of the Invention

The present invention relates to a laminate having a mono-crystal oxide conductive member on a silicon substrate, an actuator using such a laminate, an ink jet head used in an ink jet recording apparatus, and a method for manufacturing such an ink jet head.

2. Related Background Art

In recent years, printers using an ink jet recording apparatus as a printing device for a personal computer and the like have widely been popularized because they have good printing performance and are easy to handle and are inexpensive. There are various types of ink jet recording apparatuses such as an ink jet recording apparatus of type in which a bubble is generated in ink by thermal energy and an ink droplet is discharged by a pressure wave caused by the bubble, an ink jet recording apparatus of type in which an ink droplet is sucked and discharged by an electrostatic force, an ink jet recording apparatus of type in which a pressure wave caused by an oscillating element such as a piezoelectric and electrostrictive element is utilized, and the like.

In general, the ink jet recording apparatus utilizing the piezoelectric and electrostrictive elements is constructed to have pressure chambers communicated with an ink supplying chamber and ink discharge ports communicated with the pressure chambers and to include oscillating plates joined to piezoelectric elements disposed within the respective pressure chambers. With this arrangement, by expanding and contracting the piezoelectric element by applying predetermined voltage to the piezoelectric element, flexion oscillation is generated to compress ink in the pressure chamber, thereby discharging an ink droplet from the ink discharge port. Nowadays, while color ink jet recording apparatuses have been popularized, enhancement of a printing performance thereof, particularly high resolving power, high speed printing and increase in length of the ink jet head has been sought. To this end, by utilizing a multi nozzle head structure in which the ink jet heads are miniaturized, the high resolving power and the high speed printing have been realized. In order to miniaturize the ink jet head, the piezoelectric element for discharging the ink must be made smaller.

The actuator and the ink jet head, in order to make the piezoelectric and electrostrictive element smaller, it is required that the piezoelectric and electrostrictive element itself be more minute and has high piezoelectric constant not to decrease its driving capacity even if it is miniaturized. This indicates that a film having excellent crystallization of the piezoelectric and electrostrictive film is needed. The film having excellent crystallization means a uni-orientation film oriented in the same direction and a mono-crystal film having surface orientation firmly aligned. Further, in order to make the piezoelectric element and electrostrictive film to mono-crystal, a layer directly underlying the piezoelectric element film must be mono-crystal upon manufacturing the piezoelectric element film and good grating matching between the piezoelectric element film and the direct underlying layer must be maintained.

As a material providing the good grating matching between PZT piezoelectric element film and the direct underlying layer, an element using SRO which is also used as electrode material is constructed, as disclosed in Japanese Patent Application Laid-open No. 6-280023 (1994). However, in the above proposal, SRO is multi-crystal, and there is no description regarding a method for utilizing a piezoelectric element having good orientation property or mono-crystal.

By the way, for example, in order to form the mono-crystal of an oxide conductive member such as SRO on silicon, epitaxial growth is required. However, in order to achieve the epitaxial growth, an expensive method such as an MBE method is required. Further, for example, in Japanese Patent Application Laid-open No. 11-26296 (1999), a method for film-forming a mono-crystal SRO layer on the silicon is disclosed. This method is a method for forming a film via a mono-crystal layer of YSZ and $BaTiO_3$ to provide stress relaxation on the silicon in order to film-form the SRO. In this method, there were problems that crystallization of the SRO firm-formed on the silicon is apt to be worsened since the unnecessary plural layers are used and that good crystallization of the piezoelectric film formed on the SRO is hard to be obtained. Further, if mono-crystal bodies formed by a Bernoulli method are stuck together and polished, a film thickness is limited and a uniform film cannot be obtained, and, since the film itself cannot be used as an oscillating plate, it cannot be used as an electrode of an actuator of a micro-machine, which requires a thin film thickness. Furthermore, if an actuator and an ink jet head using oxide conductive material directly formed on the silicon as the electrode are driven, peeling at an interface between the oxide conductive material and the silicon is apt to occur thereby to worsen endurance.

SUMMARY OF THE INVENTION

An object of the present invention is to solve a problem that a layer structure cannot be facilitated in a laminate including mono-crystal oxide on a silicon substrate applied to a semiconductor device since the mono-crystal layer on the silicon substrate is subjected to stress and to provide a method for manufacturing a device with a simple layer structure on the silicon substrate.

Another object of the present invention is to provide a laminate having a mono-crystal oxide conductive member on a silicon substrate and adapted to manufacture an ink jet head of high density type in which miniaturization can be realized by a semiconductor process by constructing a piezoelectric element of the ink jet head with a uni-orientation or mono-crystal laminate, and an actuator and in ink jet head which use such a laminate, and methods for manufacturing such laminate, actuator and ink jet head.

The above objects are achieved by using, as a lower electrode of an actuator, oxide conductive material as electrode material of perovskite type piezoelectric and electrostrictive material and a film-forming substrate, which oxide conductive material is a mono-crystal oxide conductive member and is characterized in that an interatomic distance x of silicon and an interatomic distance y of the mono-crystal oxide conductive member satisfy the following relationship:

$$Z = \left| \frac{my}{nx} - 1 \right|_{min} \geq 0.05$$

(n and m are given positive integers, $1 \leq n \leq 5$, $1 \leq m \leq 7$ and $nx \leq 3$, $my \leq 3$)

A distance x voluntarily connecting silicon atoms exposed on a surface of the silicon substrate confronting to the mono-crystal oxide conductive member is no more than 3 nm and this distance corresponds to a distance from a certain silicon atom on a surface of a silicon wafer to any adjacent fifth silicon atom at most. A distance nx obtained by multiplying x and n similarly satisfies nx>3 nm and this distance corresponds to a distance obtained by multiplying x and 5 at most. A distance voluntarily connecting any atom constituting the mono-crystal oxide conductive member and exposed on a surface of the mono-crystal oxide conductive member confronting to the silicon to x in a one-dimensional relationship is similarly within a range no more than 3 nm and this distance corresponds to a distance from the atom on the surface of the mono-crystal oxide conductive member to any adjacent seventh atom at most. A distance obtained by multiplying y and m is similarly satisfies my>3 nm and this distance corresponds to a distance obtained by multiplying y and 7 at most.

In grating alignment regarding direct film formation of the silicon and the mono-crystal oxide conductive member, when the distance x is equal to the distance y, the epitaxial condition is satisfied. However, when x>3 nm and y>3 nm, even if x is equal to y and the film formation can be permitted under the epitaxial condition, since the number of jointing points between the silicon and the mono-crystal oxide conductive member is small to weaken a close bonding force therebetween, the mono-crystal oxide conductive member will be easily peeled from the silicon by external stress caused by a difference in thermal expansion coefficient. N and m are any positive integral numbers and there is a condition that the equal distance or the substantially equal distance is satisfied, but, if n>6 and m>8, since nx and my become greater than 3 nm, similarly, since the number of the jointing points between the silicon and the mono-crystal oxide conductive member is small to weaken the close bonding force therebetween, the mono-crystal oxide conductive member will be easily peeled from the silicon by the external stress caused by the difference in thermal expansion coefficient. For example, the distances x and y are calculated by seeking a, b and c axis lengths of crystal grating from plane distances actually measured by out of plane XRD (X-ray diffraction) and in-plane XRD (X-ray diffraction). A value Z is preferably greater than 0.06 and more preferably greater than 0.07.

In case of direct film formation, the mono-crystal oxide conductive member is easily peeled from the silicon by external stress caused by the difference in thermal expansion coefficient and misfit. To the contrary, in the present invention, by providing a transferring process for sticking the mono-crystal oxide conductive member on the silicon substrate, since the above relationship is satisfied, the peeling caused by the difference in thermal expansion coefficient and the misfit can be avoided. Incidentally, the mono-crystal is the fact that preferential orientation degree of the film in θ–2θ measurement of XRD (X-ray diffraction) is greater than 80% and preferably greater than 85% and more preferably greater than 98%. Surface roughness Ra of the mono-crystal oxide conductive member preferably satisfies Ra≦20 nm. More preferably, Ra≦10 nm is satisfied.

While the silicon substrate used in the present invention can utilize all kinds of substrate orientations such as substrate orientations (100), (111) and (110), preferably, silicon (110) in which etching can be performed in a direction perpendicular to a substrate surface by utilizing anisotropy etching. Further, while there is possibility that $SiO_2$ exists in the interface between the mono-crystal oxide conductive member and the silicon, there is no problem so long as the thickness is no more than 5 nm. Preferably, the thickness is no more than 1 nm.

As the material or substance of the mono-crystal oxide conductive member used in the present invention, oxide having a perovskite type structure can be selected. Preferably, oxide indicating conductivity of $1 \times 10^{-1}$ to $1 \times 10^{-5}$ Ω·cm is selected. Preferably, the oxide is $SrRuO_3$ (lanthanum acid strontium), La added $SrTiO_3$ (titanium acid strontium) or Nb added $SrTiO_3$ (titanium acid strontium).

The film thickness of the mono-crystal oxide conductive member is preferably no more than 3 μm. If the film thickness of the mono-crystal oxide conductive member is greater than 3 μm, there is possibility that surface roughness of the mono-crystal oxide conductive member becomes great and thus a surface polishing process is required, with the result that crystallization of the mono-crystal oxide conductive member is deteriorated or defect of the mono-crystal oxide conductive member is generated. This is nor preferable. Further, the film thickness of the oxide conductive member is preferably greater than 20 nm.

The actuator according to the present invention is constructed by using the mono-crystal oxide conductive member as a lower electrode and an epitaxial growing substrate for the perovskite type piezoelectric element and electrostrictive element and by film-forming an upper electrode of Pt/Ti, Au or Ag or the like on the perovskite type piezoelectric element and electrostrictive element. As material of the perovskite type piezoelectric element and electrostrictive element, for example, PZT $[Pb(Zr_xTi_{1-x})O_3]$, PMN $[Pb(Mg_xNb_{1-x})O_3]$, PNN $[Pb(Nb_xNi_{1-x})O_3]$, PSN $[Pb(Sc_xNb_{1-x})O_3]$, PZN $[Pb(Zn_xNb_{1-x})O_3]$, PMN-PT $[(1-y)[Pb(Mg_xNb_{1-x})O_3]-y[PbTiO_3]]$, PSN-PT $[(1-y)[Pb(Sc_xNb_{1-x})O_3]-y[PbTiO_3]]$ or PZN-PT $[(1-y)[Pb(Zn_xNb_{1-x})O_3]-y[PbTiO_3]]$ can be selected. Here, x and y are numbers no more than 1 and greater than 0. For example, in case of PMN, x is 0.2 to 0.5 and, in case of PSN, x is preferably 0.4 to 0.7, and, it is preferable that y in PMN-PT is 0.2 to 0.4, y in PSN-PT is 0.35 to 0.5 and y in PZN-PT is 0.03 to 0.35. The piezoelectric element may have single composition or a combination of two or more compositions. Alternatively, the piezoelectric element may be compound obtained by doping a small amount of elements into the above main component.

When the perovskite type piezoelectric element and electrostrictive element are mono-crystal or uni-orientation crystal, piezoelectric, mechanical and electrical properties thereof become excellent. The perovskite type piezoelectric element and electrostrictive element having crystallization indicating orientation rate greater than 85% and more preferably greater than 98% are oxide materials having further excellent piezoelectric, mechanical and electrical properties.

Concrete layer structures of the actuator portion in the ink jet head according to the present invention are listed up hereinbelow. Indication of the layer structure is upper electrode//piezoelectric element film//lower electrode/ (oscillating plate)//substrate. (//: relationship performing epitaxial growth, and /: relationship not performing epitaxial growth.) Namely, piezoelectric element film//lower electrode is epitaxial growth.

Example 1: Pt/Ti/PZT(001)//$SrRuO_3$(100)/Si(110)
Example 2: Pt/Ti/PZT(001)//La—$SrTiO_3$(100)/Si(110)
Example 3: Pt/Ti/PZT(001)//Nb—$SrTiO_3$(100)/Si(110)
Example 4: Pt/Ti/PZT(001)//$SrRuO_3$(100)/$SiO_2$/Si(110)
Example 5: Pt/Ti/PZT(001)//La—$SrTiO_3$(100)/$SiO_2$/Si (110)
Example 6: Pt/Ti/PZT(001)//Nb—$SrTiO_3$(100)/$SiO_2$/Si (110)

Example 7: Pt/Ti/PMN(001)//SrRuO$_3$(100)/Si(110)
Example 8: Pt/Ti/PMN(001)//La—SrTiO$_3$(100)/Si(110)
Example 9: Pt/Ti/PMN(001)//Nb—SrTiO$_3$(100)/Si(110)
Example 10: Pt/Ti/PMN(001)//SrRuO$_3$(100)/SiO$_2$/Si(110)
Example 11: Pt/Ti/PMN(001)//La—SrTiO$_3$(100)/SiO$_2$/Si (110)
Example 12: Pt/Ti/PMN(001)//Nb—SrTiO$_3$(100)/SiO$_2$/Si (110)

In the above examples, while the piezoelectric element film was indicated by PZT and PMN, the layer structure may be obtained by appropriately changing them to lead type piezoelectric element film PZN, PSN, PNN, PMN-PT, PSN-PT or PZN-PT, and, further, compound obtained by doping a small amount of elements such as La into the above main component as a La dope PZT: PLZT [(Pb, La) (Z, Ti)O$_3$] may be used.

The film thickness of the perovskite type piezoelectric element and electrostrictive element having mono-crystal or uni-orientation crystal is preferably greater than 5 nm as a drivable film thickness and more preferably greater than 100 nm and most preferably greater than 500 nm.

A process for film-forming the mono-crystal oxide conductive member is a process for giving epitaxy to a substrate (mono-crystal production substrate such as MgO, STO, MgAl$_2$O$_4$ which can be subjected to etching and peeling, by a spattering method, an MOCVD method, a Sol-Gel method, an MBE method, a hydrothermal synthesis method or the like.

A process for jointing the mono-crystal oxide conductive member to the silicon substrate is a process for jointing the mono-crystal oxide conductive member, for example, by using the following jointing method. The above-mentioned jointing method is, for example, jointing of the mono-crystal oxide conductive member to the silicon substrate. As the jointing methods, there are direct jointing, an active metal method and the like. The direct jointing is a method in which surface treatment of a surface of oxide is performed by using aqueous solution of NH4OH—H2O2 and the surface is overlapped with one of materials and then is heated at a temperature of 100° C. to 1000° C. in air or in vacuum, thereby achieving the jointing. The active metal method is a method in which metal such as Au/Cr is film-formed on a surface of at least one of metals which are to be jointed and after the metals are overlapped the metals are heated, for example, at a temperature of 80° C. to 300° C., thereby achieving the jointing.

A process for removing a mono-crystal substrate from the mono-crystal oxide conductive member is a process for removing the mono-crystal substrate such as MgO, STO, MgAl$_2$O$_4$ used as a mono-crystal growing substrate from the mono-crystal oxide conductive member such as SrRuO$_3$ and is a removing method performed by using dry etching or wet etching and is a method for peeling the substrate. However, this process is preferably the peeling method. In the peeling method, for example, a laser beam is illuminated, and, an excimer laser or an infrared laser is used as a peeling laser. When the peeling method performed by illuminating the excimer laser beam is used, a mono-crystal substrate having permeability of 20% or more for light having a wavelength of 230 nm to 260 nm is used as the mono-crystal substrate. When the peeling is performed by illuminating the infrared laser beam, a mono-crystal substrate having permeability of 20% or more for light having a wavelength of 700 nm to 1250 nm is used. It is also possible that, after the mono-crystal oxide conductive member is pattern-formed on the mono-crystal substrate and then is jointed to the silicon substrate, the laser beam is illuminated through the mono-crystal substrate from an opposite side of the piezoelectric element so that the transparent substrate is separated from the mono-crystal oxide conductive member by instantaneous difference in thermal expansion or thermal decomposition. Illumination energy of the laser beam is preferably greater than 50 mJ/cm$^2$ and no more than 1000 mJ/cm$^2$. When the peeling is performed by using the excimer laser, so long as there is permeability near 230 nm to 260 nm, the mono-crystal substrate according to the system of the present invention performs the adequate function. When the peeling is performed by using the infrared laser (CO$_2$ laser or YAG laser), so long as there is permeability near 700 nm to 1250 nm, the mono-crystal substrate according to the system of the present invention performs the adequate function. When the excimer laser is used, for example, MgO substrate, alumina, sapphire, quartz glass, CaCO$_3$ or LiF can be used. When the infrared laser is used, for example, MgO, MgF$_2$, Y$_2$O$_3$, CaF$_2$, quartz glass, alumina, sapphire, SrTiO$_3$ mono-crystal substrate alumina or quartz glass can be used.

A process for film-forming the perovskite type piezoelectric material and/or electrostrictive material on the mono-crystal oxide conductive member is a process for performing the epitaxial growth of the perovskite type piezoelectric material and(or) electrostrictive material by means of a spattering method, an MOCVD method, a Sol-Gel method, an MBE method or a hydrothermal synthesis method. A process for film-forming the upper electrode on the perovskite type piezoelectric material and(or) electrostrictive material is a process in which film formation is performed by a vapor-phase method such as a spattering method and a deposition method or a liquid-phase method such as a plating method.

A process for forming pressure chambers and ink supply paths in the silicon substrate is a process in which the pressure chambers and the ink supply paths are formed in the silicon substrate, for example, by using wet etching utilizing anisotropy etching or dry etching such as ICP, Liga process or Bosh process. Further, a configuration of the pressure chamber can be selected to become rectangular, circular, elliptic or the like. In addition, in case of side chuter, a cross-sectional shape of the pressure chamber can be restricted in a nozzle direction.

A process for jointing a nozzle plate in which discharge ports are formed to the pressure chambers is, for example, a process in which the nozzle plate having nozzles is jointed to align the nozzles with the respective pressure chambers. Further, the nozzles may be formed by resist material. Further, after a polymer substrate is stuck, the nozzles corresponding to the respective pressure chambers may be formed by laser processing.

In the manufacturing method for manufacturing the actuator and ink jet head according to the present invention, since the piezoelectric material and/or electrostrictive element are mono-crystal or uni-orientation similar to the mono-crystal oxide conductive member, an actuator and an ink jet head in which discharge ports are arranged with high density and have great discharging forces and which is not deteriorated due to peeling and which can cope with high frequency can be provided. The present invention has an advantage that external stress during the film formation can be removed by performing the epitaxial growth of the piezoelectric element on the mono-crystal oxide conductive member transferred to the silicon substrate. As a result, a factor for obstructing the driving is removed, and, thus, rapid progress is achieved. Further, deterioration of performance of the piezoelectric element caused by the peeling at the interface between the mono-crystal piezoelectric element and silicon or between the mono-crystal piezoelectric element and SiO$_2$ can be prevented.

DESCRIPTION OF THE PREFERRED EMBODIMENTS

Now, a mono-crystal oxide conductive member on a silicon substrate and a manufacturing method, according to the present invention, will be explained in connection with embodiments thereof.

Embodiment 1

Figure 1:
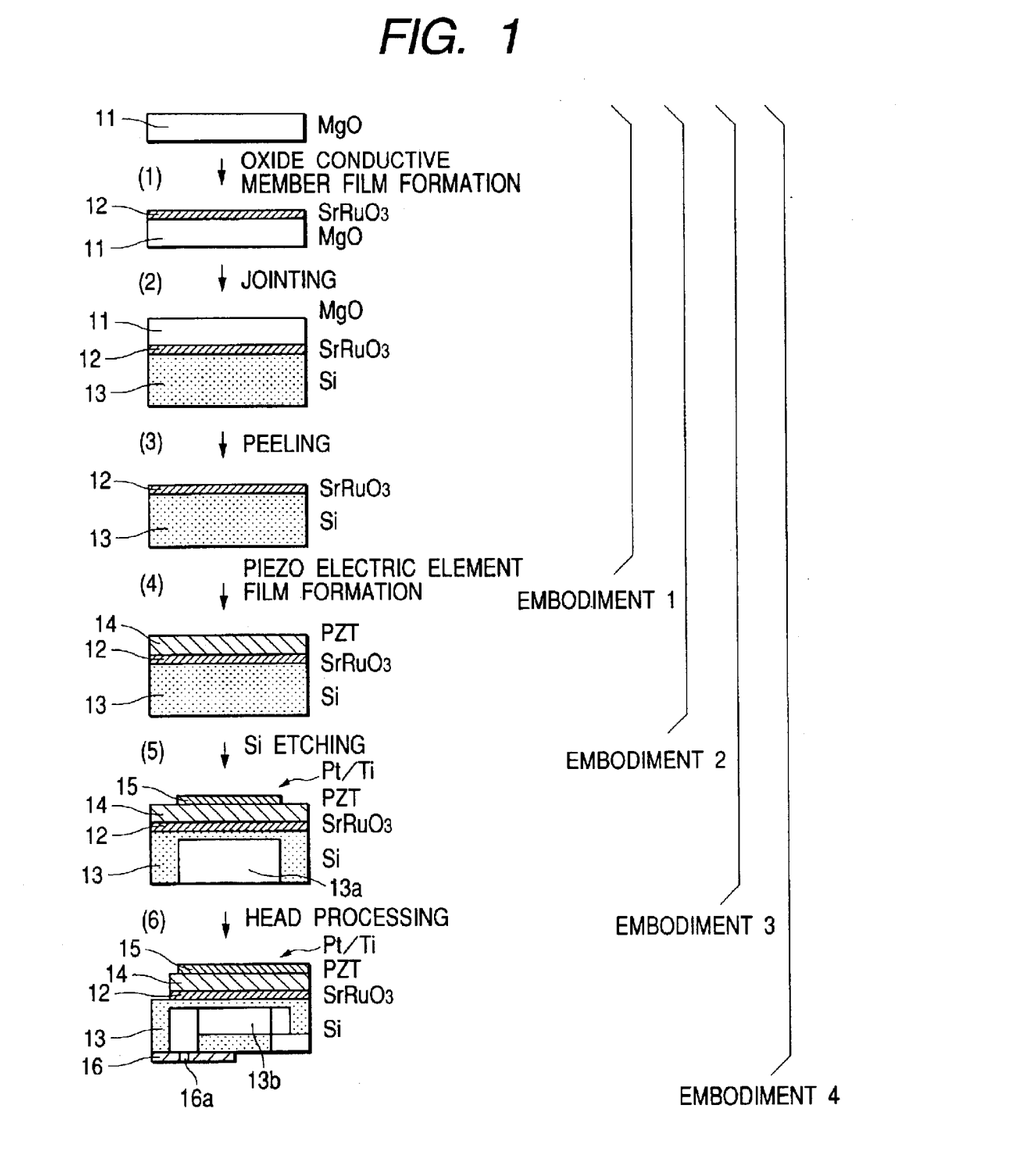
FIG. 1 is a view showing a flow chart associated with embodiments 1, 2, 3 and 4 of the present invention.

A flow chart of a method for manufacturing a mono-crystal oxide conductive member on a silicon substrate according to a first embodiment of the present invention is shown by (1) to (3) in FIG. 1.

(1) Epitaxial growth of $SrRuO_3$ as mono-crystal oxide conductive material 12 was performed on an MgO substrate (mono-crystal production substrate 11).

(2) The mono-crystal oxide conductive member obtained in this way was jointed onto a silicon substrate 13 by a direct jointing method. (3) Then, MgO (mono-crystal production substrate 11) was peeled and removed by using an excimer laser (KrF laser; exposing energy=350 mJ/cm$^2$). In this way, two kinds of mono-crystal oxide conductive member/silicon samples (sample 1 and sample 2) were produced. Regarding each of the mono-crystal oxide conductive member/silicon samples, a film thickness and surface roughness were measured by a surface step difference meter ($\alpha$-STEP). As a result, the film thickness of $SrRuO_3$ (mono-crystal oxide conductive member) was 505 nm (sample 1) and 503 nm (sample 2). The surface roughness was 11 nm (sample 1) and 12 nm (sample 2).

Figure 2:
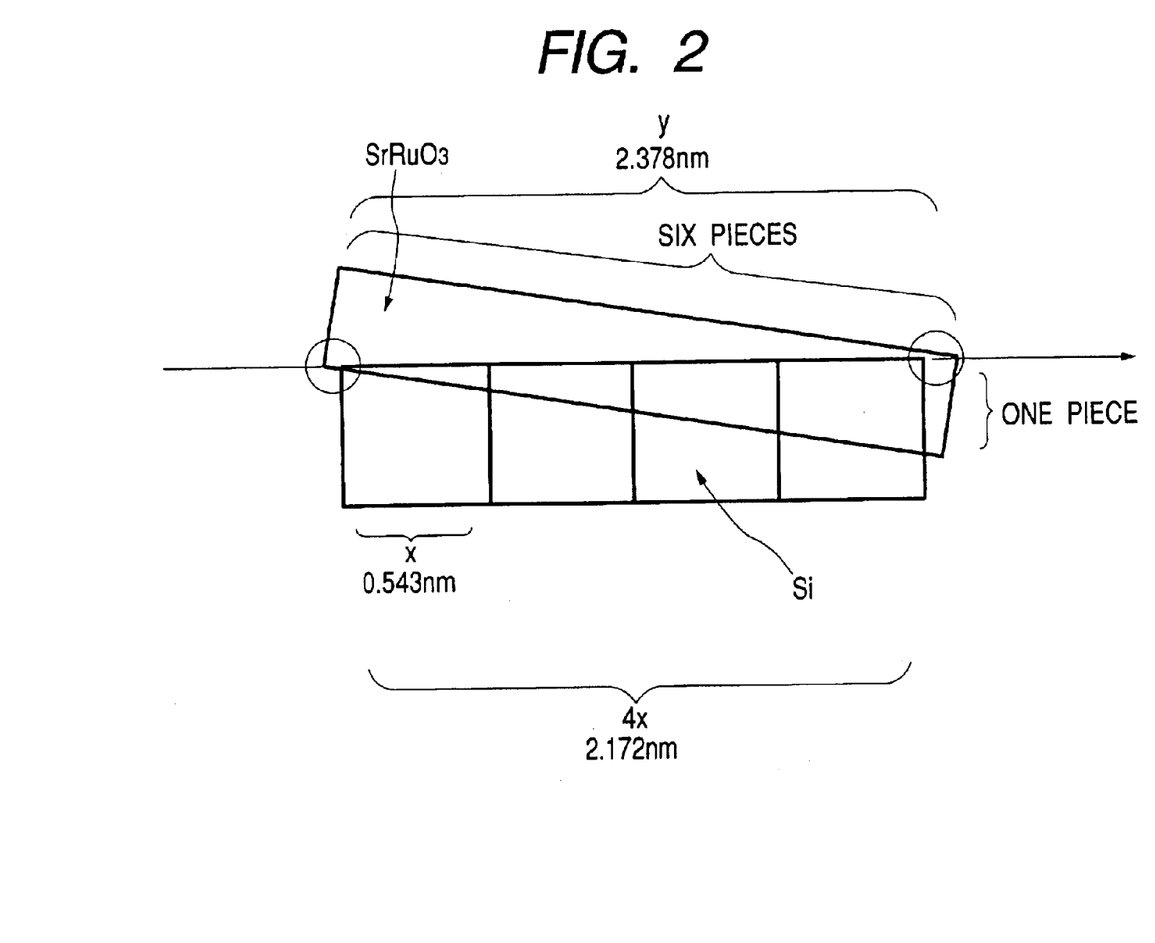
FIG. 2 is a schematic view showing a sample 1 of the embodiment 1 according to the present invention.
Figure 3:
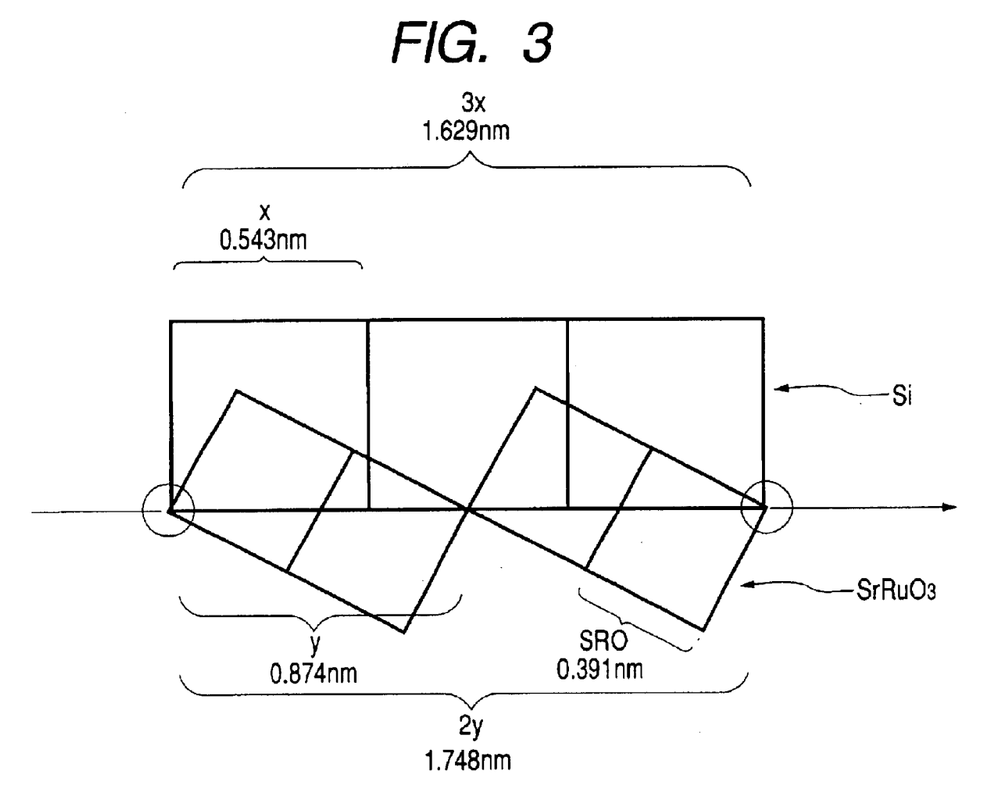
FIG. 3 is a schematic view showing a sample 2 of the embodiment 1 according to the present invention.

Further, in-pane measurement and out of plane measurement of XRD (ATX-G: manufactured by RIGAKU Co., Ltd.) were performed so that a distance x voluntarily connecting silicon atoms exposed on the surface of the silicon substrate confronting to the mono-crystal oxide conductive member within a range no more than 3 nm and a distance y voluntarily connecting an atom constituting the mono-crystal oxide conductive member and exposed on the surface of the mono-crystal oxide conductive member confronting to silicon to x within a range no more than 3 nm at a one-dimensional relationship were calculated by seeking a, b and c axes of crystal grating from a plane distance. Such results and results obtained by adding values of x and y to the above-mentioned relationship or equation are both shown in the following Table 1. Further, a relationship view of grating alignment of the sample 1 in this case is shown in FIG. 2. From FIG. 2 and Table 1, nx became 2.172 nm and my became 2.378 nm, and, by adding them to the above equation, a result that 0.05 or more is satisfied at Z=0.095 was obtained. Further, a relationship view of grating alignment of the sample 2 is shown in FIG. 3. Also from the Table 1, nx became 1.629 nm and my became 1.784 nm, and, by adding them to the above equation, a result that 0.005 or more is satisfied at Z=0.073 was obtained. In this way, the mono-crystal oxide conductive member/silicon satisfying the above equation could be manufactured by the method of the present invention.

TABLE 1

|  | Si x (nm) | SRO Y (nm) | n | m | nx (nm) | my (nm) | z |
|---|---|---|---|---|---|---|---|
| Example 1 Sample 1 | 0.543 | 2.378 | 4 | 1 | 2.172 | 2.378 | 0.095 |
| Example 2 Sample 2 | 0.543 | 0.874 | 3 | 2 | 1.629 | 1.748 | 0.073 |
| Comp. Ex. 1 | 0.768 | 0.391 | 1 | 2 | 0.768 | 0.782 | 0.018 |

$$Z = \left|\frac{my}{nx} - 1\right|_{min} \geq 0.05$$

(n and m are given positive integers, $1 \leq n \leq 5$, $1 \leq m \leq 7$ and $nx \leq 3$, $my \leq 3$)

As a result that the mono-crystal oxide conductive member/silicon was measured by a four end needle method using an Loresta-GP (MCP-600) (manufactured by MITSUBISHI Chemistry Co., Ltd.) in order to check whether the mono-crystal oxide conductive member/silicon can be used as the electrode material, it was found that specific resistance of the sample 1 is $1.2 \times 10^{-3}$ ($\Omega \cdot cm$) and specific resistance of the sample 2 is $1.1 \times 10^{-3}$ ($\Omega \cdot cm$). Further, as a result that a cross-cut test was performed in order to check close contact between the silicon substrate and the mono-crystal oxide conductive member, it was found that $SrRuO_3$ (oxide conductive members) of the samples 1 and 2 of the $SrRuO_3$ (oxide conductive member)/silicon films is not peeled at all.

Comparative Example 1

An oxide conductive member/buffer layer/silicon substrate element was manufactured by direct film formation using a spattering method. In the manufacture, first of all, YSZ (a buffer layer for obtaining matching between silicon and Pt as electrode material) was film-formed on the silicon substrate by a spattering method. In this case, by the film formation performed while heating the substrate to maintain a temperature greater than 500° C., YSZ was oriented with respect to the silicon. Further, by film-forming oxide conductive member ($SrRuO_3$) on YSZ by the similar method, $SrRuO_3$ (oxide conductive member)/YSZ (buffer layer)/silicon substrate element was obtained.

A film thickness and surface roughness of the oxide conductive member/silicon obtained in this way were measured by the surface step difference meter ($\alpha$-STEP). As a result, the film thickness of $SrRuO_3$ (mono-crystal oxide conductive member) was 512 nm. The surface roughness Ra was 22 nm.

Figure 4:
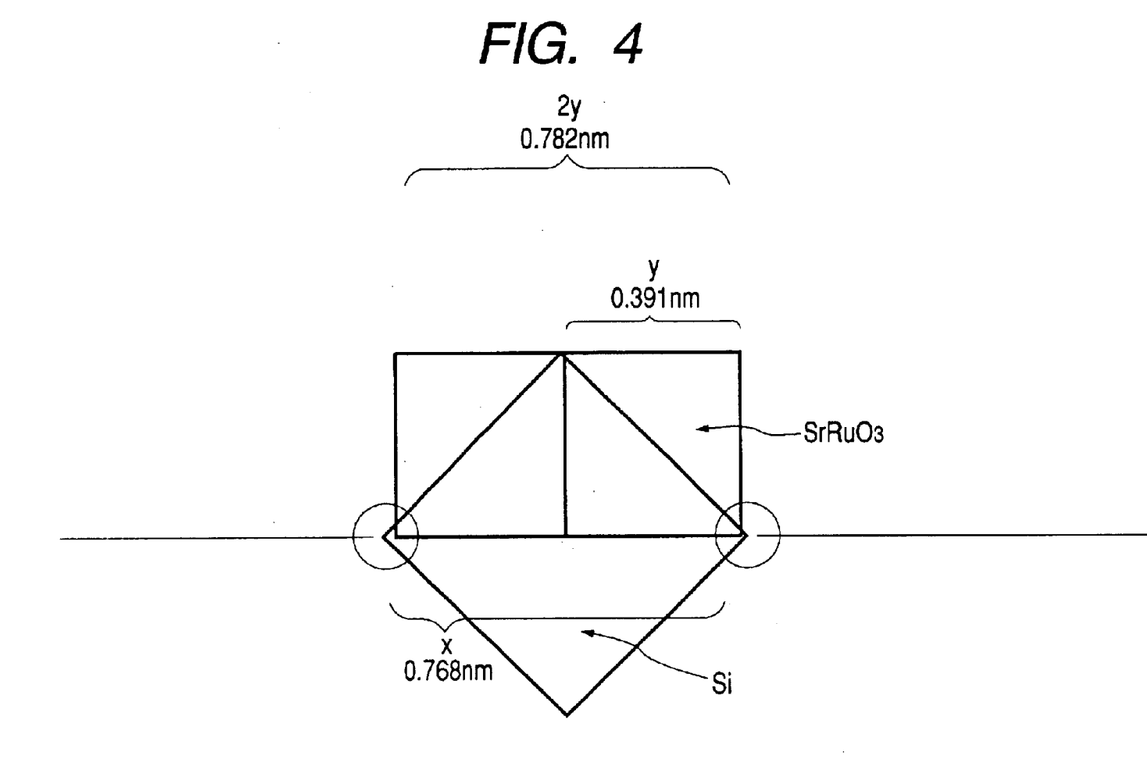
FIG. 4 is a schematic view showing a comparative example 1.

Further, in-pane measurement and out of plane measurement of XRD (ATX-G: manufactured by RIGAKU Co., Ltd.) were performed so that a distance x voluntarily connecting silicon atoms exposed on the surface of the silicon substrate confronting to the mono-crystal oxide conductive member within a range no more than 3 nm and a distance y voluntarily connecting an atom constituting the mono-crystal oxide conductive member and exposed on the surface of the mono-crystal oxide conductive member confronting to silicon to x within a range no more than 3 nm at a one-dimensional relationship were calculated by seeking a, b and c axes of crystal grating from a plane distance. Such results and results obtained by adding values of x and y to the above-mentioned or equation are both shown in the above-mentioned Table 1. Further, a relationship view of grating alignment in this case is shown in FIG. 4. From FIG. 4 and Table 1, nx became 0.768 nm and my became 0.782 nm, and, by adding them to the above equation, 0.05 or less was obtained at Z=0.018, and the oxide conductive member/silicone of the comparative example 1 did not satisfy the above equation.

As a result that the mono-crystal oxide conductive member/silicon was measured by the four end needle method using the Loresta-GP (MCP-600) (manufactured by MITSUBISHI Chemistry Co., Ltd.) in order to check whether the mono-crystal oxide conductive member/silicon can be used as the electrode material, it was found that specific resistance is $1 \times 10^{-2}$ ($\Omega \cdot cm$). Further, mono-crystallization of $SrRuO_3$ film-formed on the silicon substrate with $SrRuO_3$/YSZ is poor in comparison with the embodiment 1. Further, as a result that a cross-cut test was performed in order to check close contact between the silicon substrate and the mono-crystal oxide conductive member, the peeling was found in the $SrRuO_3$ (oxide conductive member)/YSZ (buffer layer/silicon silicon substrate element.

Embodiment 2

Next, an embodiment of a mono-crystal oxide conductive member on a silicon substrate according to a second embodiment of the present invention will be explained.

A flow chart of a method for manufacturing a piezoelectric element/mono-crystal oxide conductive member/silicon substrate according to a second embodiment of the present invention is shown by (1) to (4) in FIG. 1. Epitaxial growth of $SrRuO_3$ as mono-crystal oxide conductive material 12 was performed on an MgO substrate (mono-crystal production substrate 11) by a spattering method while adequately heating the substrate. The mono-crystal oxide conductive member obtained in this way is jointed onto a silicon substrate 13. Then, MgO (mono-crystal production substrate 11) is peeled by using an excimer laser or an infrared laser and is removed, for example, by etching using heated concentrated phosphoric acid. Here, the mono-crystal production substrate 11 may be STO, $MgAl_2O_4$ or sapphire other than MgO. In this way, the mono-crystal oxide conductive member/silicon is obtained. Further, after the substrate manufactured in this way was heated adequately, PZT 14 was film-formed on the substrate by using a spattering device, with the result that ZT (mono-crystal piezoelectric element)/$SrRuO_3$ (mono-crystal oxide conductive member)/silicon substrate could be manufactured.

When X-ray diffraction of the piezoelectric element/oxide conductive member/silicon substrate element obtained in this way was performed, it was found that PZT (piezoelectric element) of ZT (piezoelectric element)/$SrRuO_3$ (mono-crystal oxide conductive member)/silicon has C axis orientation and orientation rate of PZT (100) is 99%. Further, as a result that a cross-cut test was performed in order to check close contact between the mono-crystal oxide conductive member and PZT (piezoelectric element), it was found that PZT (piezoelectric element) of PZT (piezoelectric element)/$SrRuO_3$ (mono-crystal oxide conductive member)/silicon is not peeled at all.

A dot electrode as an upper electrode having a diameter of 10 nm was formed on an element by spattering film formation of Pt (200 nm)/Ti (20 nm) in order to measure an electrical property.

A ferroelectric property of the element was measured by using precision pro (manufactured by RADIANT). Further, $d_{33}$ measurement was performed by using a piezoelectric constant measuring device (manufactured by Toyo Technica co., Ltd.). A result is shown in the following Table 2.

TABLE 2

| | $d_{33}$ ($\mu C/cm^2$) |
|---|---|
| Example 2 | 796 |
| Comparative Example 2 | 89 |

20 V applied (10 KHz)
φ10 nm

Comparative Example 2

A piezoelectric element/lower electrode/buffer layer/silicon substrate element was manufactured by direct film formation using a spattering method. In the manufacture, first of all, YSZ (a buffer layer for obtaining matching between silicon and Pt as electrode material) was film-formed on the silicon substrate by a spattering method. In this case, by the film formation performed while heating the substrate to maintain a temperature greater than 500° C., YSZ was oriented with respect to the silicon. Further, a film was obtained by film-forming $SrRuO_3$ (oxide conductive member) on YSZ by the similar method. Further, a piezoelectric orientation film was obtained by film-forming the piezoelectric element PZT on $SrRuO_3$ (oxide conductive member) by the similar method.

When X-ray diffraction of the piezoelectric element/oxide conductive member/silicon substrate element obtained in this way was performed, it was found that orientation rate of PZT (001) of the $SrRuO_3$ (oxide conductive member) is 60%. Further, as a result that a cross-cut test was performed in order to check close contact between the mono-crystal oxide conductive member and piezoelectric element PZT, it was found that $SrRuO_3$ (oxide conductive member)/YSZ (buffer layer)/silicon substrate element is not peeled at all.

A dot electrode as an upper electrode having a diameter of 10 nm was formed on an element by spattering film formation of Pt (200 nm)/Ti (20 nm) in order to measure an electrical property. A ferroelectric property of the element was measured by using precision pro (manufactured by RADIANT). Further, $d_{33}$ measurement was performed by using a piezoelectric constant measuring device (manufactured by Toyo Technica co., Ltd.). A result is shown in the above Table 2.

Embodiment 3

Figure 5:
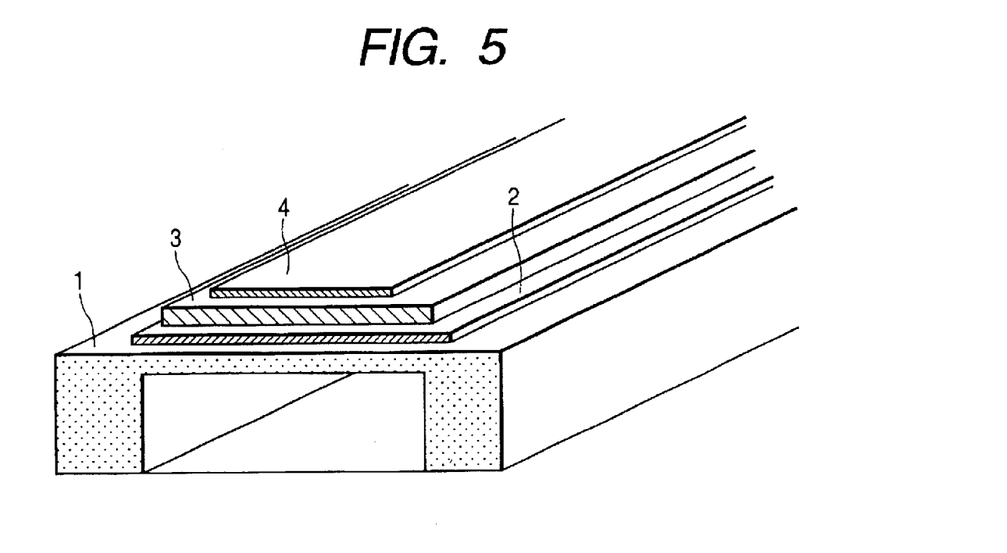
FIG. 5 is a perspective view showing the embodiment 3 according to the present invention.

A flow chart for the manufacture of an actuator using the piezoelectric element/mono-crystal oxide conductive member/silicon substrate according to a third embodiment of the present invention is shown in FIG. 1. As shown in (5) of FIG. 1, an upper electrode 15 was provided on PZT 14 and a recess 13a was formed in the silicon substrate 13. A construction of an actuator according to the embodiment of the present invention in which a film is vibrated upwardly and downwardly by applying voltage is shown in FIG. 5. In FIG. 5, the reference numeral 1 denotes a substrate; 2 denotes a mono-crystal oxide conductive member; 3 denotes a piezoelectric element; and 4 denotes an upper electrode. A layer structure according to the illustrated embodiment is Pt/Ti (upper electrode)/PZT (mono-crystal piezoelectric element)/$SrRuO_3$ (mono-crystal oxide conductive member)/silicon substrate. A film thickness of this actuator is Pt/Ti (upper electrode) (200 nm/20 nm)/PZT (piezoelectric element) (3 μm)/SrRuO₃ (mono-crystal oxide conductive member) (0.5 μm)/silicon substrate (600 μm). A displacement amount achieved when voltage of 20 V is applied to the actuator is shown in the following Table 3. With the above-mentioned layer structure, displacement of 0.3 to 0.4 μm could be obtained.

TABLE 3

| Example 3 | 415 |
|---|---|
| Comparative Example 3 | 51 |

20 V applied (10 KHz)
φ10 nm

Further, while the driving was performed by 10⁹ Times or more by inputting 20 V, 20 kHz and rectangular wave, attenuation of the displacement due to deterioration and/or peeling of the film could not found.

Comparison Example 3

Figure 6:
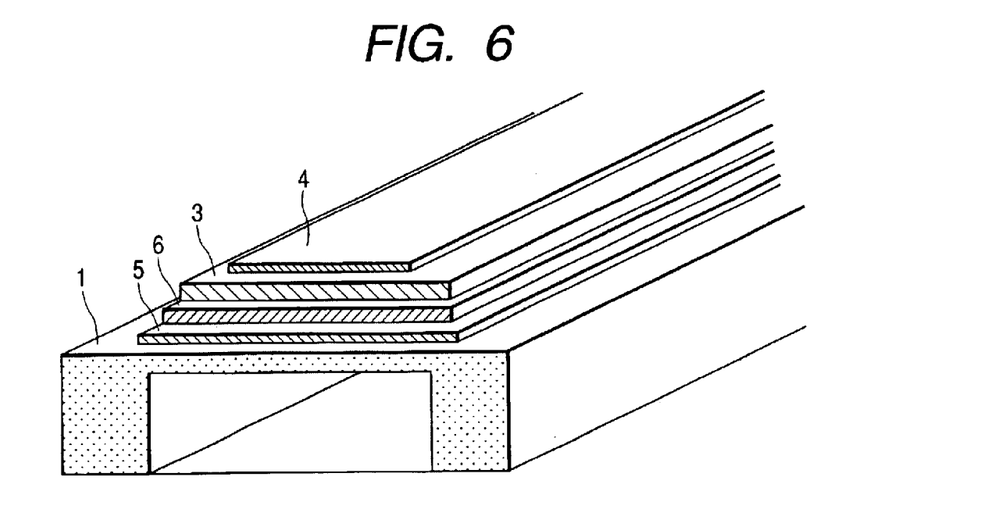
FIG. 6 is a perspective view showing a comparative example 3.

An actuator shown in FIG. 6 was manufactured by using the piezoelectric element/lower electrode/buffer layer/silicon substrate element of the comparative example 2. In this case, an oscillating plate is YSZ. Film thicknesses of various films are Pt/Ti (upper electrode) (200 nm/20 nm)/PZT (piezoelectric element) (3 μm)/SrRuO₃ (mono-crystal oxide conductive member) (0.5 μm)/YSZ (2 μm)/silicon substrate (600 μm). In FIG. 6, the reference numeral 1 denotes a silicon substrate; 3 denotes a piezoelectric element; 4 denotes an upper electrode; 5 denotes an oscillating plate and a buffer layer; and 6 denotes a lower electrode. A displacement amount achieved when voltage of 20 V is applied to the actuator is shown in the above Table 3. The displacement of the actuator in the comparative example 3 was 51 nm. When input of 20 V, 20 kH and rectangular wave was continued, if the driving exceeds 10⁴ times, attenuation of the displacement caused by deterioration and/or peeling of the film was found.

Embodiment 4

Figure 7:
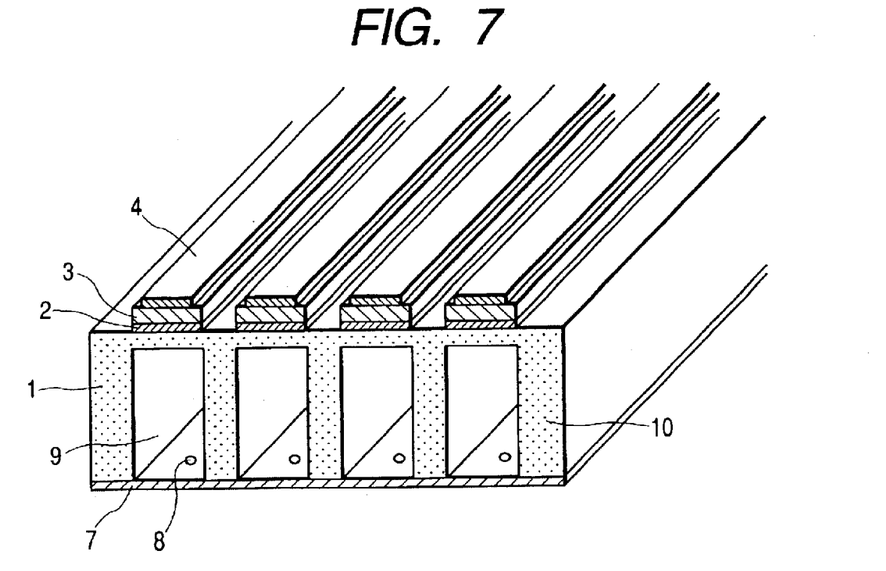
FIG. 7 is a perspective view showing the embodiment 4 according to the present invention.

FIG. 7 is a perspective view of an ink jet head according to an embodiment of the present invention. The ink jet head includes a plurality of discharge ports 8, a pressure chambers 9 corresponding to the respective discharge ports 8 and piezoelectric elements 2 provided within the respective pressure chambers 9 and is constructed as follows. In FIG. 7, the reference numeral 1 denotes a silicon substrate; 2 denotes a mono-crystal oxide conductive member; 3 denotes a piezoelectric element; 4 denotes an upper electrode; 7 denotes a nozzle plate; 8 denotes discharge ports; 9 denotes pressure chambers; and 10 denotes pressure chamber walls. The layer structure according to the illustrated embodiment is Pt/Ti (upper electrode)/PZT (mono-crystal piezoelectric element)/SrRuO₃ (mono-crystal oxide conductive member)/silicon substrate. Film thicknesses of various films are Pt/Ti (upper electrode) (200 nm/20 nm)/PZT (mono-crystal piezoelectric element) (3 μm)/SrRuO₃ (mono-crystal oxide conductive member) (0.5 μm)/silicon substrate (600 μm). Further, a width of the pressure chamber 9 is 90 μm and a width of the pressure chamber wall 10 is 50 μm in order to realize 180 dpi.

An ink jet head having 180 dpi was manufactured by the ink jet head manufacturing process of FIG. 1 by using the actuator obtained in the embodiment 3. As shown in (6) of FIG. 1, ink flow paths 13b were formed in the silicon substrate 13 and a discharge port plate 16 having discharge ports 16a was provided.

The following Table 4 shows a discharge amount and a discharge speed of an ink droplet when voltage of 20 V and frequency of 20 kHz are applied to the ink jet head of the embodiment 4. From the Table 4, in the respective layer structures, the discharge amount of 15 pl and the discharge speed of 12 m/sec could be obtained.

TABLE 4

| Example 4 | 15 | 12 |
|---|---|---|
| Comp. Example 4 | 8 | 8 |

20 V applied (10 KHz)
φ10 nm

Comparative Example 4

Figure 8:
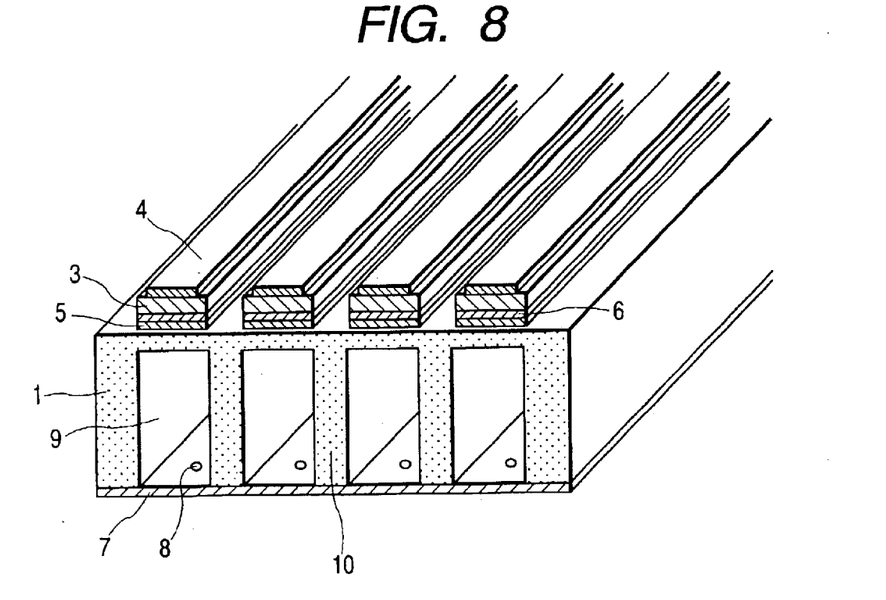
FIG. 8 is a perspective view showing a comparative example 4.

An ink jet head having the following construction was manufactured as a comparative example of the embodiment 4. Such an ink jet head is shown in FIG. 8. In FIG. 8, the reference numeral 1 denotes a silicon substrate; 3 denotes a piezoelectric element; 4 denotes an upper electrode; 5 denotes an oscillating plate and a buffer layer; 6 denotes a lower electrode; 7 denotes a nozzle plate; 8 denotes discharge ports; 9 denotes pressure chambers; and 10 denotes pressure chamber walls. The layer structure according to the illustrated example is Pt/Ti (upper electrode)/PZT (mono-crystal piezoelectric element)/SrRuO₃ (mono-crystal oxide conductive member)/YSZ (buffer layer)/silicon substrate. Film thicknesses of various films are Pt/Ti (upper electrode) (200 nm/20 nm)/PZT (mono-crystal piezoelectric element) (3 μm)/SrRuO₃ (mono-crystal oxide conductive member) (0.5 μm)/YSZ (buffer layer) (2 μm)/silicon substrate (600 μm). Further, similar to the embodiment 4, a width of the pressure chamber 9 was selected to 90 μm and a width of the pressure chamber wall 10 is selected to 50 μm in order to realize 180 dpi.

In the manufacture, first of all, an YSZ oscillating plate was film-formed on the silicon substrate by a spattering method or the like. In this case, by performing the film formation while heating the substrate to maintain a temperature of 500° C. or more, the YSZ oscillating plate 5 having high orientation could be firm-formed. Further, a film having high orientation could be obtained by film-forming SrRuO₃ oxide conductive material on the high orientation YSZ oscillating plate 5 as the lower electrode 6 by the similar method. Further, a high orientation film of the piezoelectric element could be obtained by film-forming the PZT piezoelectric element 3 on the high orientation SrRuO₃ lower electrode 6. The upper electrode 4 could be obtained by the spattering method similar to the embodiment 4.

Thereafter, similar to the embodiment 4, an ink jet head having 180 dpi was manufactured by the above-mentioned ink jet head manufacturing process. Constructions of materials of various layers, and a discharge amount and a discharge speed of an ink droplet achieved when voltage of 20 V and frequency of 10 kHz are applied to the elements are shown in the Table 4. From the Table 4, with this layer structure, the discharge amount was 8 pl and the discharge speed was 8 m/sec.

What is claimed is:

1. A laminate having a mono-crystal oxide conductive member on a silicon substrate, wherein a distance x between silicon atoms and a distance y between atoms of said mono-crystal oxide conductive member satisfy the following relationship:

$$Z = \left|\frac{my}{nx} - 1\right|_{min} \geq 0.05$$

(n and m are given positive integers, $1 \leq n \leq 5$, $1 \leq m \leq 7$ and $nx \leq 3$, $my \leq 3$)
where x is the distance between any two silicon atoms exposed on a surface of said silicon substrate confronting said mono-crystal oxide conductive member and nx is a value no more than 3 nm, and y is the distance between any two atoms constituting said mono-crystal oxide conductive member and exposed on a surface of said mono-crystal oxide conductive member confronting the silicon and my is a value no more than 3 nm.

2. A laminate according to claim 1, wherein a film thickness of said mono-crystal oxide conductive member is no more than 3 μm.

3. An actuator comprising:
a laminate according to claim 1 in which a perovskite type piezoelectric material and/or an electrostrictive material are laminated onto said mono-crystal oxide conductive member.

4. An actuator according to claim 3, wherein the perovskite type piezoelectric material and/or the electrostrictive material have mono-crystal or uni-orientation.

5. An actuator according to claim 4, wherein orientation rates of the perovskite type piezoelectric material and/or the electrostrictive material are greater than 85%.

6. An actuator according to claim 4, wherein orientation rates of the perovskite type piezoelectric material and/or the electrostrictive material are greater than 98%.

7. An ink jet head comprising an ink discharge nozzle, a pressure chamber communicated with said ink discharge nozzle, an ink supply path communicated with said pressure chamber and an actuator portion provided within said pressure chamber, wherein:
said actuator portion is constituted by an actuator according to claim 3.

8. A method for manufacturing a laminate having a mono-crystal oxide conductive member on a silicon substrate, comprising the steps of:
providing said mono-crystal oxide conductive member on a mono-crystal substrate;
joining said mono-crystal oxide conductive member to said silicon substrate; and
removing said mono-crystal substrate from said mono-crystal oxide conductive member.

9. A method for manufacturing a laminate according to claim 8, wherein the step for removing said mono-crystal substrate from said mono-crystal oxide conductive member is a peeling step performed by using light illumination.

10. A method for manufacturing an ink jet head having a mono-crystal oxide conductive member on a silicon substrate and having a perovskite type piezoelectric material and/or an electrostrictive material on said mono-crystal oxide conductive member and having an upper electrode on said perovskite type piezoelectric material and/or said electrostrictive material and including a nozzle plate provided with a discharge port, a pressure chamber communicated with said discharge port and an ink supply path communicated with said pressure chamber, comprising the steps of:
providing said mono-crystal oxide conductive member on a mono-crystal substrate;
joining said mono-crystal oxide conductive member to said silicon substrate;
removing said mono-crystal substrate from said mono-crystal oxide conductive member;
providing said perovskite type piezoelectric material and/or said electrostrictive material on said mono-crystal oxide conductive member;
providing said upper electrode on said perovskite type piezoelectric material and/or said electrostrictive material;
forming said pressure chamber and said ink supply path; and
joining said nozzle plate in which said discharge port is formed to said pressure chamber.

11. A method for manufacturing an ink jet head according to claim 10, wherein the step for removing said mono-crystal substrate from said mono-crystal oxide conductive member is a peeling step performed by using light illumination.

12. A method for manufacturing an actuator having a mono-crystal oxide conductive member on a silicon substrate and having a perovskite type piezoelectric material and/or an electrostrictive material on said mono-crystal oxide conductive member and having an upper electrode on said perovskite type piezoelectric material and/or said electrostrictive material, comprising the steps of:
providing said mono-crystal oxide conductive member on a mono-crystal substrate;
joining said mono-crystal oxide conductive member to said silicon substrate;
removing said mono-crystal substrate from said mono-crystal oxide conductive member;
providing said perovskite type piezoelectric material and/or said electrostrictive material on said mono-crystal oxide conductive member; and
providing said upper electrode on said perovskite type piezoelectric material and/or said electrostrictive material.

13. A method for manufacturing an actuator according to claim 12, wherein the step for removing said mono-crystal substrate from said mono-crystal oxide conductive member is a peeling step performed by using light illumination.

* * * * *

UNITED STATES PATENT AND TRADEMARK OFFICE
CERTIFICATE OF CORRECTION

PATENT NO.      : 6,854,832 B2
DATED           : February 15, 2005
INVENTOR(S)     : Takanori Matsuda It is certified that error appears in the above-identified patent and that said Letters Patent is hereby corrected as shown below:

Column 1,
Line 55, "has" should read -- have --.

Column 2,
Line 49, "in" should read -- an --.
Line 67, "3)" should read -- 3). --.

Column 3,
Lines 2 and 12, "confronting to" should read -- facing --.
Line 17, "is" should be deleted.
Lines 27 and 36, "small" should read -- small so as to --.

Column 4,
Line 38, "is" (both ocurrences) should read -- be --.
Line 39, "is" should read -- be --.

Column 5,
Line 38, "NH40H-H2O2" should read -- $NH_4OH$-$H_2O_2$ --.

Signed and Sealed this

First Day of November, 2005

JON W. DUDAS
*Director of the United States Patent and Trademark Office*